United States Patent

[11] 3,585,272

[72] Inventor Solomon Shatz
Santa Clara, Calif.

[21] Appl. No. 862,851
[22] Filed Oct. 1, 1969
[45] Patented June 15, 1971

[73] Assignee Fairchild Camera and Instrument Corporation
Mount View, Calif.

[54] SEMICONDUCTOR PACKAGE OF ALUMINA AND ALUMINUM
9 Claims, 4 Drawing Figs.

[52] U.S. Cl. 174/52S, 174/15 R, 317/234 A, 317/234 G
[51] Int. Cl. H05k 5/00
[50] Field of Search 174/52.5, 52.6, 16, 15; 317/234.3, 234.3.1, 234.4, 234.1, 100

[56] References Cited

UNITED STATES PATENTS

| | | | |
|---|---|---|---|
| 3,118,016 | 1/1964 | Stephenson, Jr. | 174/68.5 |
| 3,469,684 | 9/1969 | Keady et al. | 174/FP |

*Primary Examiner*—Darrell L. Clay
*Attorneys*—Roger S. Borovoy and Alan H. MacPherson

ABSTRACT: A semiconductor package capable of dissipating large amounts of power consists of a first portion of hard, electrically insulating material containing a cavity for holding a semiconductor ship and a second underlying portion of softer insulating material separated from the first portion by a layer of pliable, thermally conductive material.

PATENTED JUN 15 1971 3,585,272

INVENTOR.
SOLOMON SHATZ
BY Alan H. MacPherson
ATTORNEY

SEMICONDUCTOR PACKAGE OF ALUMINA AND ALUMINUM

BACKGROUND OF THE INVENTION

1. Field of the Invention

This invention relates to a package for a semiconductor device capable of dissipating large amounts of power.

2. Prior Art

Semiconductor packages usually reflect a compromise between the requirements of high reliability and thus good package strength, the ability to dissipate power, and relatively low cost. Most semiconductor packages are a combination of several different materials. To ensure good reliability, most materials used in a semiconductor package are selected because their thermal expansion coefficients are substantially similar. As the power dissipated by the device within the package increases, the stresses induced in the package by adjacent materials possessing mismatched thermal expansion coefficients likewise increase. Accordingly, semiconductor packages containing materials with different expansion coefficients are usually suitable only for very low power devices. As the power dissipated by a device increases, the stresses induced in the package by this power become quite large and can, if the package is improperly designed, result in destruction of the package.

As integrated circuits become more and more complicated, that is, as more functions are placed on one semiconductor chip, the power dissipated by the integrated circuit increases.

SUMMARY OF THE INVENTION

The package of this invention overcomes the limitations of prior art packages. Although made of materials with mismatched expansion coefficients, the package of this invention has the ability to dissipate large amounts of power. Finally, the package of this invention is relatively inexpensive to build.

According to this invention, a semiconductor package is constructed of a first portion, brittle but nonconducting, overlying a second softer portion, both portions being separated by a soft material such as silicone grease. In one embodiment of this invention, the first portion is alumina ceramic and the second portion is anodized aluminum. The semiconductor die is mounted in a cavity in the alumina ceramic. Leads from the die are attached to conductive pins passing through both the alumina and an underlying aluminum support. The underlying aluminum is soft compared to the alumina and is also completely anodized so as to electrically insulate the conductive pins from the aluminum. Because the aluminum is quite pliable and ductile, the alumina-aluminum package can be bolted to a support substrate without breaking. Pins from the semiconductor die through the package are sealed to the alumina both by crimping and bending and by allowing a plastic to flow down the pins to occupy the annular spaces between the pins and the alumina.

Alternatively, an hermetic package can be made by placing glass or other similar sealing material around the pins and over the cavity in which the die is mounted. A void is left around the die to prevent contaminating the active areas of the die.

DETAILED DESCRIPTION

Figures 1, 4:
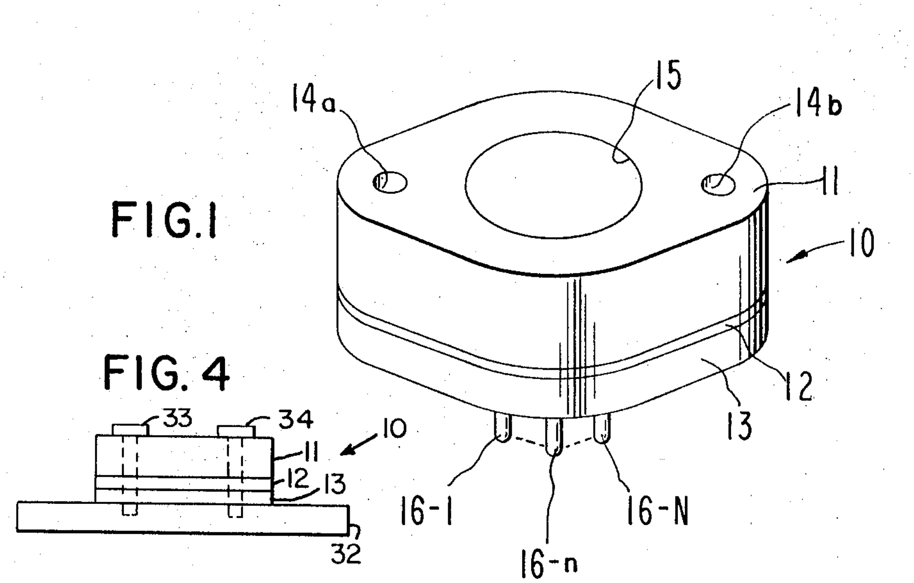
FIGS. 1, 2 and 3 show an isometric and two cross-sectional views respectively, of the package of this invention.
FIG. 4 shows the package of this invention bolted to a support substrate.

FIG. 1 shows an isometric view of the package of this invention. An alumina ceramic top portion 11 is placed over an aluminum bottom plate 13 and separated therefrom by a layer 12 of a pliable, soft, high heat conductivity material. Silicone heat conductive grease is one such material. Layer 12 is typically 1 to 4 mils. thick and serves as a heat conductive thermal interface between alumina top plate 11 and aluminum bottom plate 13. Beryllia spheres, typically about 1 mil. in diameter, can be added to layer 12 to increase the heat conductivity of the silicone grease by as much as a factor of four. Since aluminum 13 is much softer than alumina 11, the aluminum acts as a pad conforming to irregularities of the surface to which the package is fastened, and prevents breaking the more brittle alumina. Bolt holes 14*a* and 14*b* pass through both alumina 11 and aluminum 13 to allow the package to be bolted to a support as shown in FIG. 4. Bolts 33 and 34 hold package 10 to support substrate 32 as shown. When the alumina and aluminum portions of the package are bolted together, layer 12 is squeezed, expelling some material and improving the heat transfer properties of this layer.

In the center of alumina 11 is a cavity 15 in which is placed a semiconductor chip 20 containing typically an integrated circuit. Electrically conductive pins 16–1 through 16–N, are shown in FIG. 1 extending from the bottom of the package. N is an integer representing the total number of pins extending from the package. While only 3 pins are shown in FIG. 1, it should be understood that as many pins can be used with this package as are necessary to connect the integrated circuit on chip 20 to external circuitry. Pins 16 are locked to alumina top portion 11 by being bent so as to lie in radially extending slots on the bottom surface of cavity 15 and by being crimped to produce regions 29 (FIG. 2) of larger diameter then the normal pin diameter. Regions 29 abut the bottom surface of alumina 11. Because pins 29 are pretensioned, regions 29 together with the bent top portions of the pins hold in tension the portions of the pins passing through alumina 11 and thus firmly lock the pins in the alumina 11.

Figure 2:
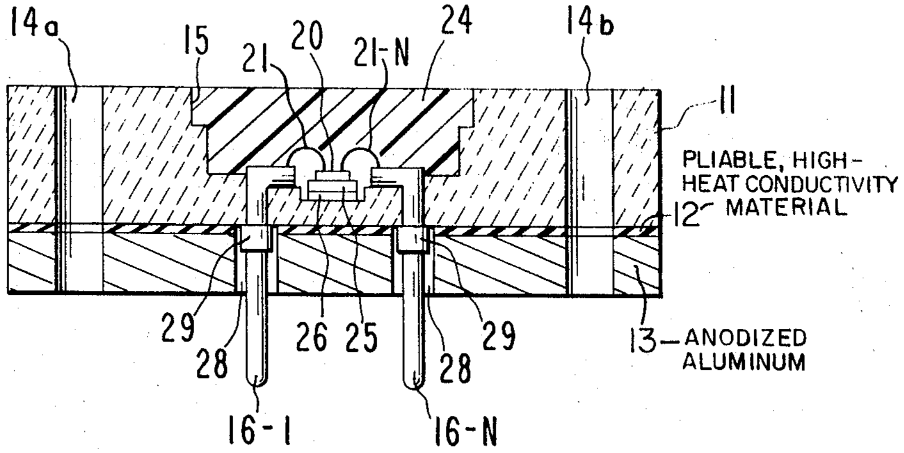

FIG. 2 shows in cross section the package of FIG. 1 together with a semiconductor device on chip 20 placed within cavity 15. As illustrated in FIG. 2, leads 21 through 21–N extend from contact pads on chip 20 to corresponding ones of pins 16–1 through 16–N.

Chip 20 is bonded to the bottom of ceramic 11 by any of several well-known bonding techniques. One such technique might comprise first coating the bottom of chip 20 with a gold layer and then alloying (i.e., die attaching) chip 20 to a corresponding metal layer, typically gold, on ceramic 11. Alternatively, aluminum or other appropriate materials such as molybdenum-manganese or platinum-paladium can be used for this coating. Many of the other compounds ordinarily used for thick films are also appropriate for this coating.

In the embodiment shown in FIG. 2, however, a layer of molybdenum 25, with a thermal expansion coefficient matching that of the overlying silicon chip, is placed directly under chip 20. Underlying molybdenum 25 is heat-dissipating copper slug 26 which in turn is bonded to alumina 11 by a layer of solder bonded to a gold film on the surface of alumina 11. This arrangement reduces the thermal gradients within the package when chip 20 produces a large amount of power (i.e. over 2 watts of power, for example).

Semiconductor chip 20 is sealed in cavity 15 by an epoxy or any other well-known plastic material used in the semiconductor arts for packaging. To seal this chip 20, a thermosetting plastic 24 is cast in cavity 15 around the top surface of the alumina. Such casting processes are well known in the semiconductor art. Material 31, which can be plastic, is also forced into annular spaces 23 (FIG. 3) in alumina 11 adjacent pins 16.

The underlying aluminum plate 13 is quite soft vis-a-vis the ceramic. Typically, the alumina ceramic has a compressive strength of 400,000 p.s.i., while aluminum has a compressive strength of only 40,000 p.s.i. Thus any stresses induced in the package by attaching the package to a support will be relieved in the underlying aluminum plate 13 and will not fracture the brittle but hard top alumina plate 11. Accordingly, package 10 can be attached to an underlying frame or support by bolts through holes 14*a* and 14*b*.

Aluminum plate 13 is anodized by placing the aluminum in an electrolytic solution such as sulfuric acid with a potential of about 15 to 20 volts applied to produce a current density of 12 to 15 amps per square foot. After approximately 10 minutes, aluminum plate 13 has been so anodized as to be essentially an insulator. The oxide surface, normally porous, is sealed by immersing the anodized part in boiling de-ionized water. Oxide thickness is about 0.1 mil. and dry breakdown of the oxide typically occurs when a potential greater than 100 to 200 volts is applied across the oxide. However, the oxide can be as thick as 5 mils.

Figure 3:
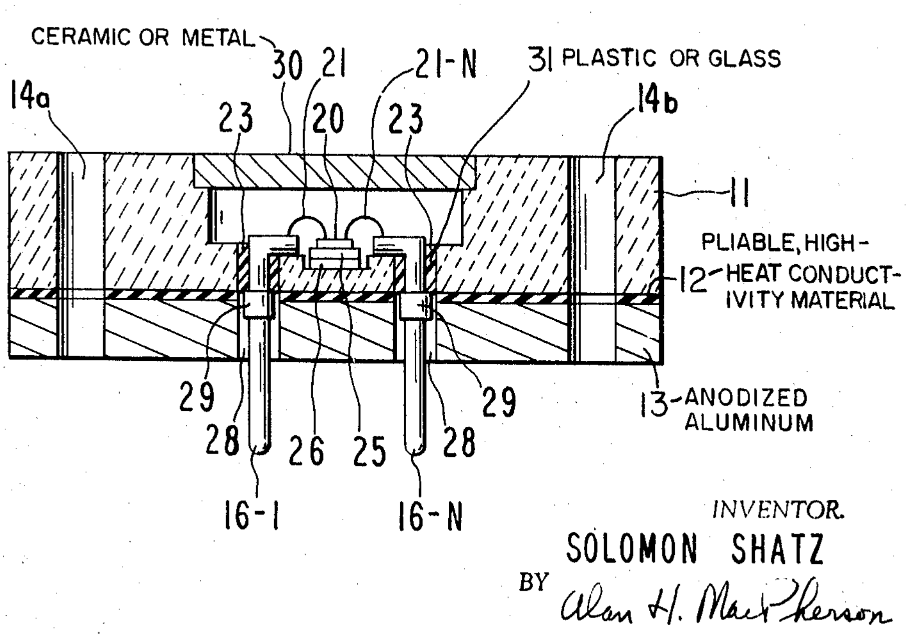

The package can be made hermetic by placing an hermetic lid 30, such as ceramic or metal, over cavity 15, as shown in FIG. 3, and likewise using a glass sealant for material 31 in and around pins 16–1 through 16–N in the annular space 23 between these leads and alumina ceramic plate 11.

It should be noted that in the packages of both FIG. 2 and FIG. 3, pins 16 are separated from anodized aluminum 13 by annular spaces 28, occupied by air.

The resulting package is unique in that alumina ceramic 11 has not been physically joined to aluminum plate 13. Rather, a slip-joint exists between these two plates consisting of silicone grease 12 or some other heat conductive material of similar consistency. If semiconductor chip 20 produces a large amount of heat, both the alumina ceramic and the aluminum are free to expand and contract relative to each other without breaking the flexible joint between the two. Thus, structural integrity of the package is maintained while the compressive forces holding the alumina-ceramic plate 11 to the aluminum plate 13 are sufficiently strong to maintain the package in its proper orientation. The hermetic sealing, if any, between pins 16–1 and the corresponding portions of the alumina-ceramic portion 11 is not destroyed by any relative motion between the alumina and aluminum portions of the package because annular spaces 28 between pins 16 and aluminum 13 allow movement of these pins relative to aluminum 13.

While the package of this invention has been described as containing an alumina top portion and aluminum bottom portion, other materials can, of course, be used.

What I claim is:

1. A microelectronic package comprising:
a first portion of electrically nonconducting material containing a cavity therein for holding a semiconductor chip;
a bottom second portion adjacent said first portion but separated therefrom by a layer of pliable high-heat conductivity material; and
bolts passing through said first and second portions and into an underlying substrate thereby to hold said first portion and said second portion in fixed relationship to each other.

2. A microelectronic package comprising:
a first portion of electrically nonconducting material containing a cavity therein for holding a semiconductor chip; and
a bottom second portion adjacent said first portion but separated therefrom by a layer of pliable high-heat conductivity material;
said first and second portions containing selected passages, the passages through said first portion being aligned with the passages through said second portion, said passages in said first and second portions containing electrically conductive pins which run from the cavity in said first portion through said first and second portions and extend a selected distance beyond said second portion.

3. Structure as in claim 2 in which said first portion possesses a first thermal expansion coefficient and said second portion possesses a second thermal expansion coefficient different from said first thermal expansion coefficient.

4. Structure as in claim 2 in which the second portion of said package is more ductile than said first portion of said package.

5. Structure as in claim 2 in which first portion of said package is alumina ceramic, said second portion of said package is anodized aluminum, and said first and second portions are separated by a layer of silicone grease.

6. Structure as in claim 5 in which said silicone grease contains beryllia spheres.

7. Structure as in claim 5 including a semiconductor chip hermetically sealed in said cavity by a layer of material extending across and closing said cavity, said semiconductor chip being connected by electrically conductive leads to said electrically conductive pins, said pins being hermetically sealed to said passages in said first portion.

8. Structure as in claim 7 in which said hermetic seal across said cavity is flush with one surface of said first portion of said package.

9. Structure as in claim 5 including a semiconductor chip sealed in said cavity by a plastic extending across and closing said cavity, said semiconductor chip being connected by electrically conductive leads to said electrically conductive pins, said plastic also occupying the annular spaces in said passages in said first portion between said pins and said first portion.